United States Patent
Lee et al.

(10) Patent No.: US 8,154,198 B2
(45) Date of Patent: Apr. 10, 2012

(54) ORGANIC LIGHT EMITTING DIODE DISPLAY AND METHOD FOR MANUFACTURING THE SAME

(75) Inventors: Ung-Soo Lee, Suwon-si (KR); Tae-Wook Kang, Suwon-si (KR); Jang-Hwan Shin, Suwon-si (KR); Yong-Jin Lee, Suwon-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 123 days.

(21) Appl. No.: 12/585,151

(22) Filed: Sep. 4, 2009

(65) Prior Publication Data

US 2010/0102719 A1    Apr. 29, 2010

(30) Foreign Application Priority Data

Oct. 29, 2008    (KR) .................. 10-2008-0106543

(51) Int. Cl.
*H01J 1/62* (2006.01)
*H01J 63/04* (2006.01)

(52) U.S. Cl. ........ 313/504; 313/498; 313/506; 313/512; 445/24; 445/25

(58) Field of Classification Search .......... 313/498–512; 445/24–25
See application file for complete search history.

(56) References Cited

U.S. PATENT DOCUMENTS

| | | | | |
|---|---|---|---|---|
| 2007/0126357 A1* | 6/2007 | Lee et al. | | 313/512 |
| 2007/0170861 A1* | 7/2007 | Lee et al. | | 313/512 |
| 2008/0111479 A1* | 5/2008 | Choi et al. | | 313/504 |
| 2008/0143247 A1* | 6/2008 | Kim et al. | | 313/504 |
| 2009/0015136 A1* | 1/2009 | Lee et al. | | 313/503 |
| 2009/0066242 A1* | 3/2009 | Koo | | 313/506 |
| 2009/0195147 A1* | 8/2009 | Song et al. | | 313/504 |

FOREIGN PATENT DOCUMENTS

| | | |
|---|---|---|
| JP | 2007-048474 | 2/2007 |
| KR | 10-1998-0023383 | 7/1998 |
| KR | 10-2003-0067145 A | 8/2003 |
| KR | 10-2006-0134804 A | 12/2006 |

* cited by examiner

*Primary Examiner* — Toan Ton
*Assistant Examiner* — Kevin Quarterman
(74) *Attorney, Agent, or Firm* — Robert E. Bushnell, Esq.

(57) ABSTRACT

The present invention relates to an OLED display and a manufacturing method thereof, and the OLED display according to the present invention includes a display substrate including an OLED, a sealing member disposed opposite to the display substrate and covering the OLED, and a sealant interposed between the display substrate and the sealing member and that seals them to each other, and the sealant has a curved inner surface and an angular outer surface in at least one of corner areas of the display substrate and the sealing member.

18 Claims, 5 Drawing Sheets

ORGANIC LIGHT EMITTING DIODE DISPLAY AND METHOD FOR MANUFACTURING THE SAME

CLAIM OF PRIORITY

This application makes reference to, incorporates the same herein, and claims all benefits accruing under 35 U.S.C. §119 from an application earlier filed in the Korean Intellectual Property Office on Oct. 29, 2008 and there duly assigned Serial No. 10-2008-0106543.

BACKGROUND OF THE INVENTION

1. Field of the Invention

The present invention relates to an organic light emitting diode (OLED) display and a manufacturing method thereof. More particularly, the present invention relates to an OLED display that improves mechanical strength and suppresses generation of a failure in a manufacturing process.

2. Description of the Related Art

An OLED display includes a plurality of OLEDs including hole injection electrodes, an organic light emission layer, and electron injection electrodes. Light is emitted by energy generated when excitons generated as electrons and holes are combined drop from an excited state to a ground state, and the OLED display displays an image by using the light.

Accordingly, the OLED display has self-luminance characteristics, and unlike a liquid crystal display (LCD), the thickness and weight thereof can be reduced since a separate light source is not required. Further, because the OLED display has high quality characteristics such as low power consumption, high luminance, and high reaction speed, the OLED display is appropriate for use in a mobile electronic device.

In general, the OLED display includes a display substrate in which an OLED is formed, and a sealing member that covers the display substrate. The display substrate and the sealing member are sealed by a sealant.

In addition, the OLED display is initially manufactured in a state of a mother display panel and then formed by cutting the mother display panel. That is, the mother display panel is divided into a plurality of OLED displays through a cutting process.

However, a part of the OLED display, particularly a corner area of the OLED display, may be broken during the process of dividing the mother display panel into the plurality of OLED displays through the cutting process.

Further, when the corner area of the OLED display is broken, the sealant is also damaged so that the internal elements of the OLED display cannot be stably sealed.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide an OLED display having advantages of improving mechanical strength and suppressing generation of a failure during a manufacturing process.

In addition, the present invention provides a manufacturing method of the OLED display.

An exemplary OLED display according to an embodiment of the present invention includes a display substrate including an OLED, a sealing member disposed opposite to the display substrate and covering the OLED, and a sealant interposed between the display substrate and the sealing member to seal the display substrate and the sealing member. The sealant has a curved inner surface and an angular outer surface in at least one of corner areas of the display substrate and the sealing member.

The width of the sealant formed in the at least one of the corner areas of the display substrate and the sealing member may be gradually increased near a corner of the corner area.

The outer surface of the sealant may be substantially parallel with an edge of the sealing member.

The curved inner surface of the sealant may have a curvature radius in a range of about 0.5 mm to 1.5 mm.

The sealant may include at least one of a frit and epoxy resin.

The OLED display may further include a reinforcing member disposed adjacent to the outer surface of the sealant and filling a space between the display substrate and the sealing member.

An exemplary manufacturing method of an OLED display according to another embodiment of the present invention includes: preparing a mother display substrate and a mother sealing member; coating a sealant on at least on of the mother display substrate and the mother sealing member; sealing the mother display substrate and the mother sealing member while interposing the sealant therebetween; and cutting the sealed mother display substrate and the mother sealing member together and dividing them into a plurality of OLED displays. The sealant is formed along an edge of the plurality of OLED displays to be formed by division, and, in a corner area of at least one of corner areas of the OLED display, the sealant has a curved inner surface and an angular outer surface.

The width of the sealant formed in the at least one of the corner areas of the OLED display may be gradually increased near a corner of the corner area.

The outer surface of the sealant may be substantially parallel with an edge of the sealing member.

The curved inner surface of the sealant may have a curvature radius in a range of about 0.5 mm to 1.5 mm.

The sealant may include at least one of a frit and epoxy resin.

The sealant may be formed by a screen printing method.

The manufacturing method may further include filling a space between the mother display substrate and the mother sealing member with a reinforcing member that is adjacent to the outer surface of the sealant.

The reinforcing member may be filled by using a capillary effect.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE EMBODIMENTS

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

The drawings and description are to be regarded as illustrative in nature and not restrictive. Like reference numerals designate like elements throughout the specification.

In addition, the size and thickness of each element in the drawing are random samples for better understanding and ease of description, and the present invention is not limited thereto.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present. In contrast, when an element is referred to as being "directly on" another element, there are no intervening elements present.

In addition, in the accompanying drawings, an organic light emitting diode (OLED) display is illustrated as an active matrix (AM)-type OLED display in a 2Tr-1Cap structure in which two thin film transistors (TFTs) and one capacitor are formed in one pixel, but the present invention is not limited thereto. Therefore, the OLED display can have various structures. For example, three or more TFTs and two or more capacitors can be provided in one pixel of the OLED display, and separate wires can be further provided in the OLED display. Here, the pixel is a minimum unit for displaying an image, and the OLED display displays an image by using a plurality of pixels.

Hereinafter, an exemplary embodiment of the present invention will be described with reference to FIG. 1 to FIG. 4.

Figure 1:
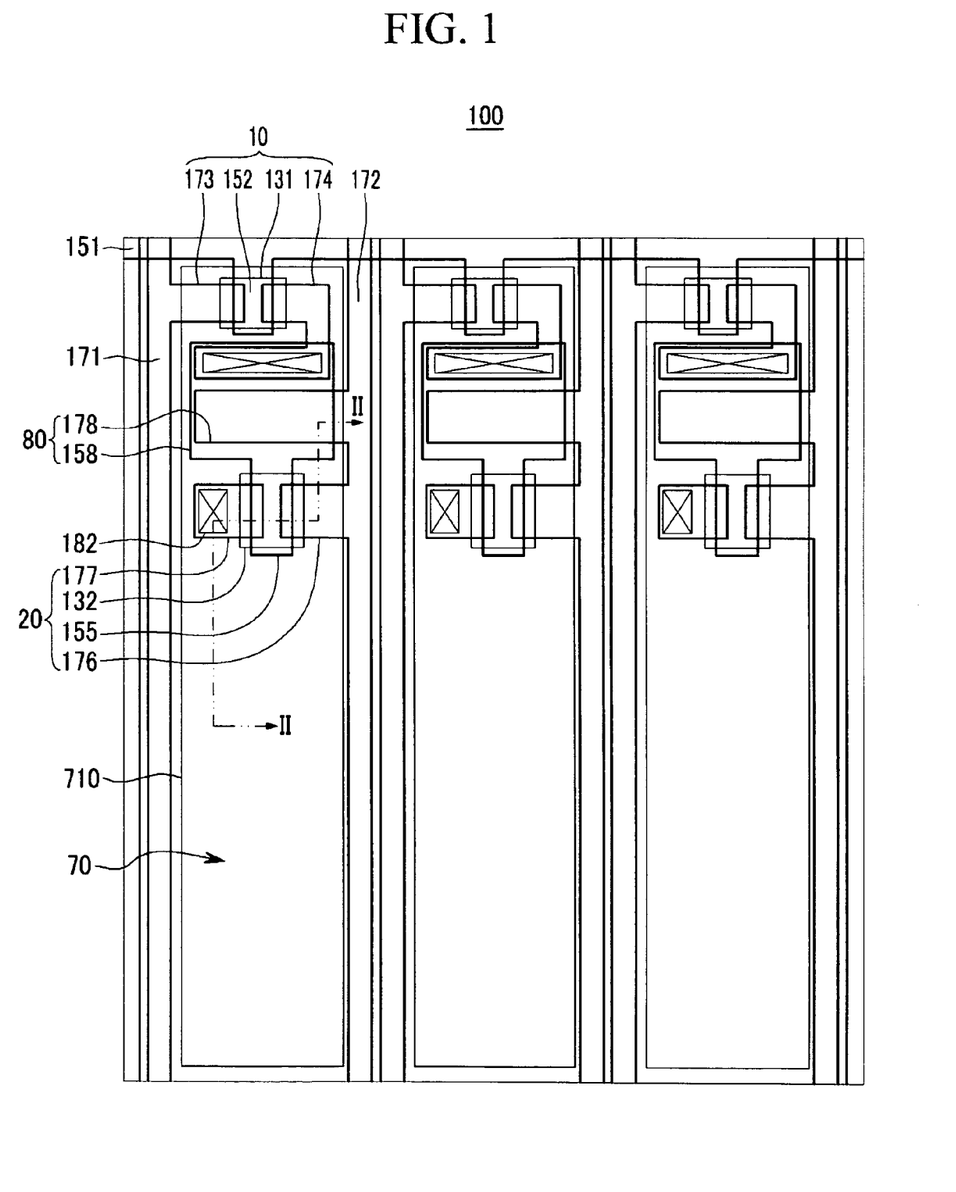
FIG. 1 is a layout view of an organic light emitting diode (OLED) display according to an exemplary embodiment of the present invention.
Figure 2:
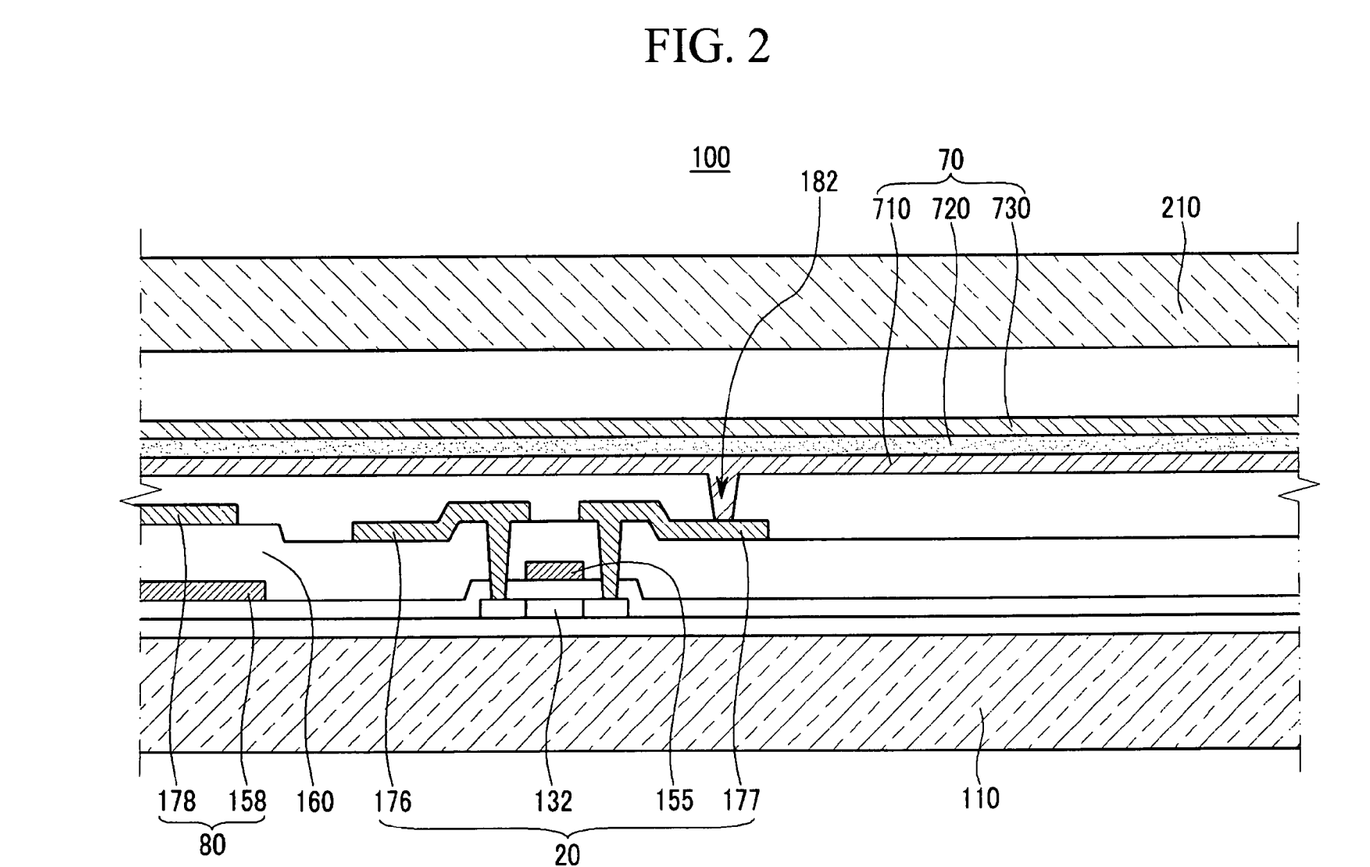
FIG. 2 is a cross-sectional view of FIG. 1, taken along the line II-II.

As shown in FIG. 1 and FIG. 2, an organic light emitting diode (OLED) display 100 according to an exemplary embodiment of the present invention broadly includes a display substrate 110 and a sealing member 210 arranged opposite to the display substrate 110. In addition, the OLED display 100 further includes a sealant 350 (shown in FIG. 3) interposed between the display substrate 110 and the sealing member 210 to seal them. In further detail, the sealant 350 is formed along edges of the display substrate 110 and the sealing member 210.

The display substrate 110 includes a switching thin film transistor (TFT) 10, a driving TFT 20, a capacitor 80, and an OLED 70 for each pixel. In addition, the display substrate 110 further includes gate lines 151 disposed along one direction, and data lines 171 and common power lines 172 that are insulated from and intersect the gate lines 151. Here, one pixel may be defined as a boundary of the gate line 151, the data line 171, and the common power line 172, but is not limited thereto.

The OLED 70 includes a first electrode 710, an organic emission layer 720 formed on the first electrode 710, and a second electrode 730 (shown in FIG. 2) formed on the organic emission layer 720. Here, the first electrode 710 is a positive (+) electrode which is a hole injection electrode, and the second electrode 730 is a negative (−) electrode which is an electron injection electrode. However, the present invention is not limited thereto, and thus the first electrode 710 may be the negative electrode and the second electrode 730 may be the positive electrode according to a driving method of the OLED display 100. Holes and electrodes are inserted into the organic emission layer 720 respectively from the first electrode 710 and the second electrode 730. When excitons in which the injected holes and electrons are coupled fall from an exited state to a ground state, light is emitted.

The capacitor 80 includes a first capacitive plate 158 and a second capacitive plate 178 that are disposed with an interlayer insulation layer 160 (shown in FIG. 2) disposed therebetween. Herein, the interlayer insulation layer 160 becomes a dielectric material. The amount of charges charged in the capacitor 80 and a voltage between the first and second capacitive plates 158 and 178 determine capacitance of the capacitor 80.

The switching TFT 10 includes a switching semiconductor layer 131, a switching gate electrode 152, a switching source electrode 173, and a switching drain electrode 174, and the driving TFT 20 includes a driving semiconductor layer 132, a driving gate electrode 155, a driving source electrode 176, and a driving drain electrode 177.

The switching TFT 10 is used as a switch for selecting a pixel to be light-emitted. The switching gate electrode 152 is connected to the gate line 151. The switching source electrode 173 is connected to the data line 171. The switching drain electrode 174 is disposed at a distance from the switching source electrode 173 and is connected to the first capacitive plate 158.

The driving TFT 20 applies a driving power to the first electrode 710 for light emission of an organic emission layer 720 of an OLED 70 in a selected pixel. The driving gate electrode 155 is connected to the first capacitive plate 158. The driving source electrode 176 and the second capacitive plate 178 are respectively connected to the common power line 172. The driving drain electrode 177 is connected to the first electrode of the OLED 70 through a contact hole 182.

With the above-described structure, the switching TFT 10 is driven by a gate voltage applied to the gate line 151 and transmits a date voltage applied to the data line 171 to the driving TFT 20. A voltage corresponding to a voltage difference between a common voltage applied to the driving TFT 20 from the common power line 172 and the data voltage transmitted from the switching TFT 10 is stored in the capacitor 80, and a current corresponding to the voltage stored in the capacitor 80 flows to the OLED through the driving TFT 20 so that the OLED 70 emits light.

The sealing member 210 covers the switching and driving TFTs 10 and 20 and the OLED 70 of the display substrate 110 to protect them from the external environment.

Figure 3:
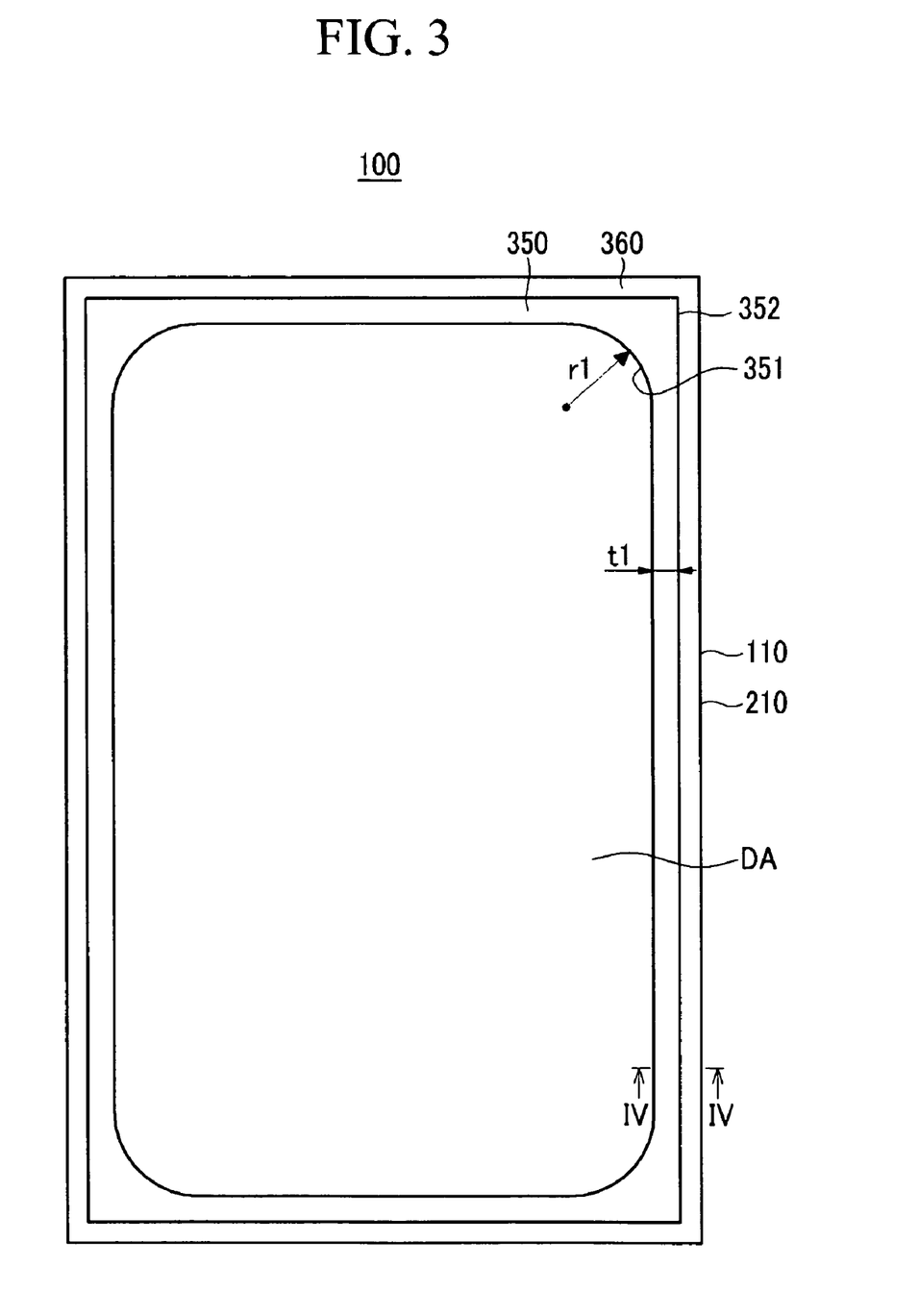
FIG. 3 is a top plan view of a location of a sealant in the OLED display of FIG. 1.

As shown in FIG. 3, a sealant 350 in a corner area of at least one of the display substrate 110 and the sealing member 210 has a curved inner surface 351 and an angular outer surface 352. The sealant 350 in each corner area of the display substrate 110 and the sealing member 210 has the curved inner surface 351 and the angular outer surface 352 in FIG. 3, but the exemplary embodiment of the present invention but is not limited thereto.

Meanwhile, an inner surface 351 and an outer surface 352 of a sealant 350 in other areas, excluding the corner areas of the display substrate 110 and the sealing member 210, are formed to be substantially parallel with each other. That is, the width of the sealant 350 is constant in other areas excluding the corner areas of the display substrate 110 and the sealing member 210, and is gradually increased near the corner areas of the display substrate 110 and the sealing member 210. In addition, the outer surface of the sealant 350 is formed to be substantially parallel with an edge of the sealing member 210.

Further, the curved inner surface 351 in the corner areas of the display substrate 110 and the sealing member 210 has a curvature radius (r1) of a range within 0.5 mm to 1.5 mm. The angular outer surface 352 of the sealant 350 is bent to be substantially a right-angle at a corner thereof.

For example, when an average width (t1) of the sealant 350 is within a range of 0.5 mm to 0.7 mm, the curvature radius of the curved inner surface 351 of the sealant may be 0.7 mm at a corner area.

When the curvature radius of the curved inner surface 351 of the sealant 350 is less than 0.5 mm, a difference between the width of the curved inner surface 351 and the width of the angular outer surface 352 is too small to expect the effect of the present invention, that is, improvement in mechanical strength. On the contrary, when the curvature radius of the curved inner surface 351 of the sealant 350 is greater than 1.5 mm, a display area DA inside the sealant 350 may be influenced. That is, it is difficult to efficiently design a location to which the sealant 350 is applied.

A plurality of pixels are formed in a display area DA inside the inner surface 351 of the sealant 350, and each pixel is provided with an OLED 70. That is, a display area DA surrounded by the sealant 350 substantially becomes an image display area.

The sealant 350 is made of a material including a frit. However, the exemplary embodiment of the present invention is not limited thereto. Therefore, the sealant 350 may be made of a material including epoxy resin, or various other materials.

Figure 4:
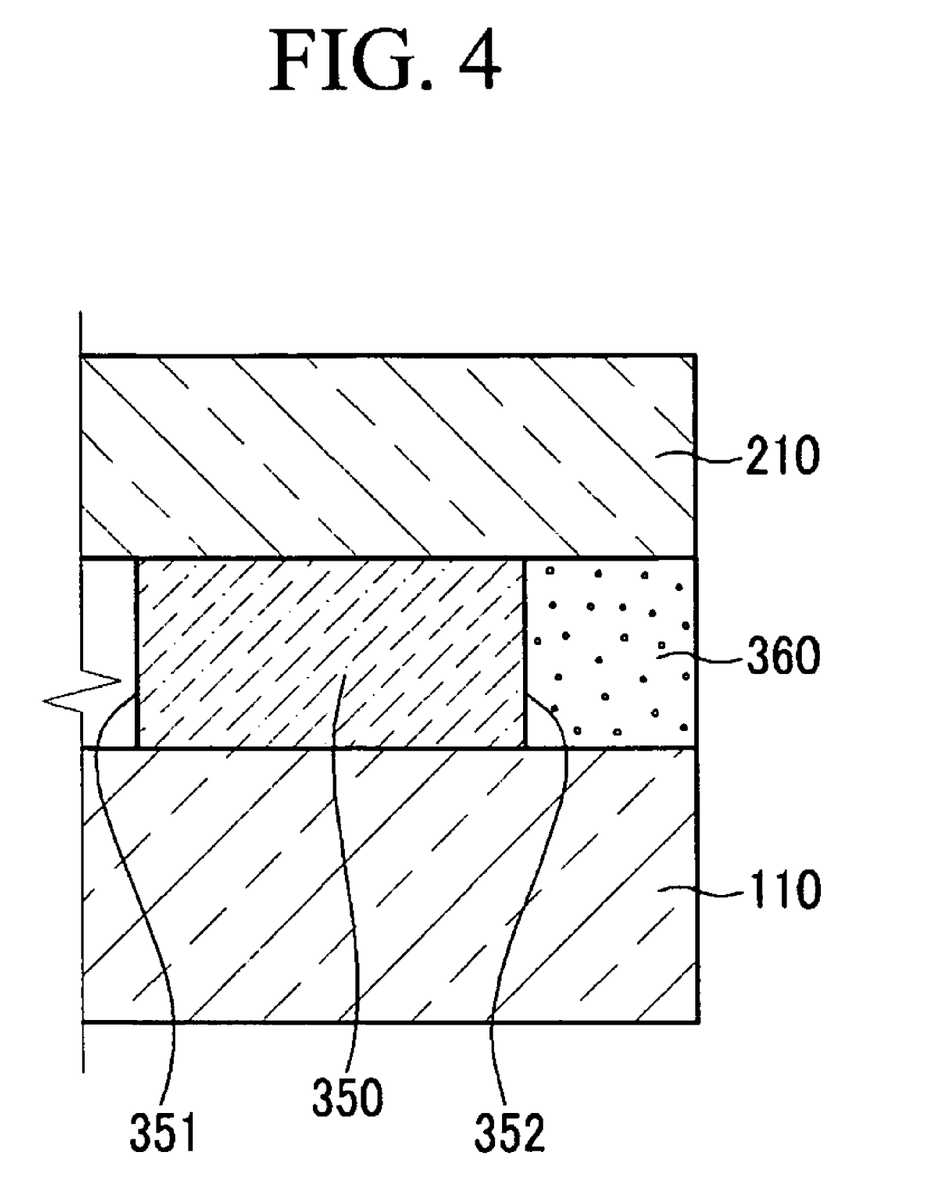
FIG. 4 is a cross-sectional view of FIG. 3, taken along the line IV-IV.

In addition, as shown in FIG. 4, the OLED display 100 may further include a reinforcement member 360 disposed adjacent to the outer surface 352 of the sealant 350 and that fills a space between the display substrate 110 and the sealing member 210.

The reinforcing member 360 prevents the display substrate 110, the sealing member 210, and the sealant 350 from being easily broken, and functions as an assistant sealing member when a sealant 350 made of a frit becomes molten or its adhesive force becomes weak.

The reinforcing member 360 is made of resin that is naturally hardened or is hardened by heat or ultraviolet (UV) rays. For example, a naturally hardened material includes acrylcyanoate, a material that is hardened at a temperature of less that 80° C. includes acrylate, and a material that is hardened by UV rays includes epoxy, acrylate, and urethaneacrylate. These materials are applied in a liquid state and then hardened to form the reinforcing member 360.

With the above-described configuration, the OLED display 100 can be improved in mechanical strength and can suppress defects during a manufacturing process.

In general, the OLED display 100 is manufactured to a mother display panel 500 (shown in FIG. 5) and then divided into a plurality of OLED displays 100 through a cutting process. When divided through the cutting process, excessive pressure is applied to the OLED display 100. Due to the pressure, the OLED display 100 may have a broken corner or may be otherwise damaged. However, since the sealant 350 is disposed to the corner of the corner area of the OLED display 100, damage to the corner area of the OLED display 100 can be suppressed. That is, since the sealant 350 supports the display substrate 110 and the sealing member 210 at the corner area of the OLED display 100, displacement in the vertical direction that occurs when the display substrate 110 and the sealing member 210 are pressed during the cutting process can be reduced, thereby suppressing a problem in which the OLED display 100 is broken.

Particularly, the OLED display 100 have be further improved in mechanical strength since the sealant 350 has the curved inner surface 351 and the angular outer surface 352 in the corner areas of the display substrate 110 and the sealing member 210.

In addition, even if the corner areas of the OLED display 100 are damaged during the cutting process, the display substrate 110 and the sealing member 210 can be maintained in the sealed state since the corner areas of the sealant 350 are relatively broad.

Further, the reinforcing member 360 prevents the display substrate 110 and the sealing member 210 from being broken, and functions as an auxiliary sealing member when the display substrate 110 or the sealing member 210 is damaged.

In addition, since the inner surface 351 of the sealant 350 is curved round at the corner areas of the display substrate 110 and the sealing member 210, a coating area of the sealant 350 can be more efficiently designed.

Figure 5:
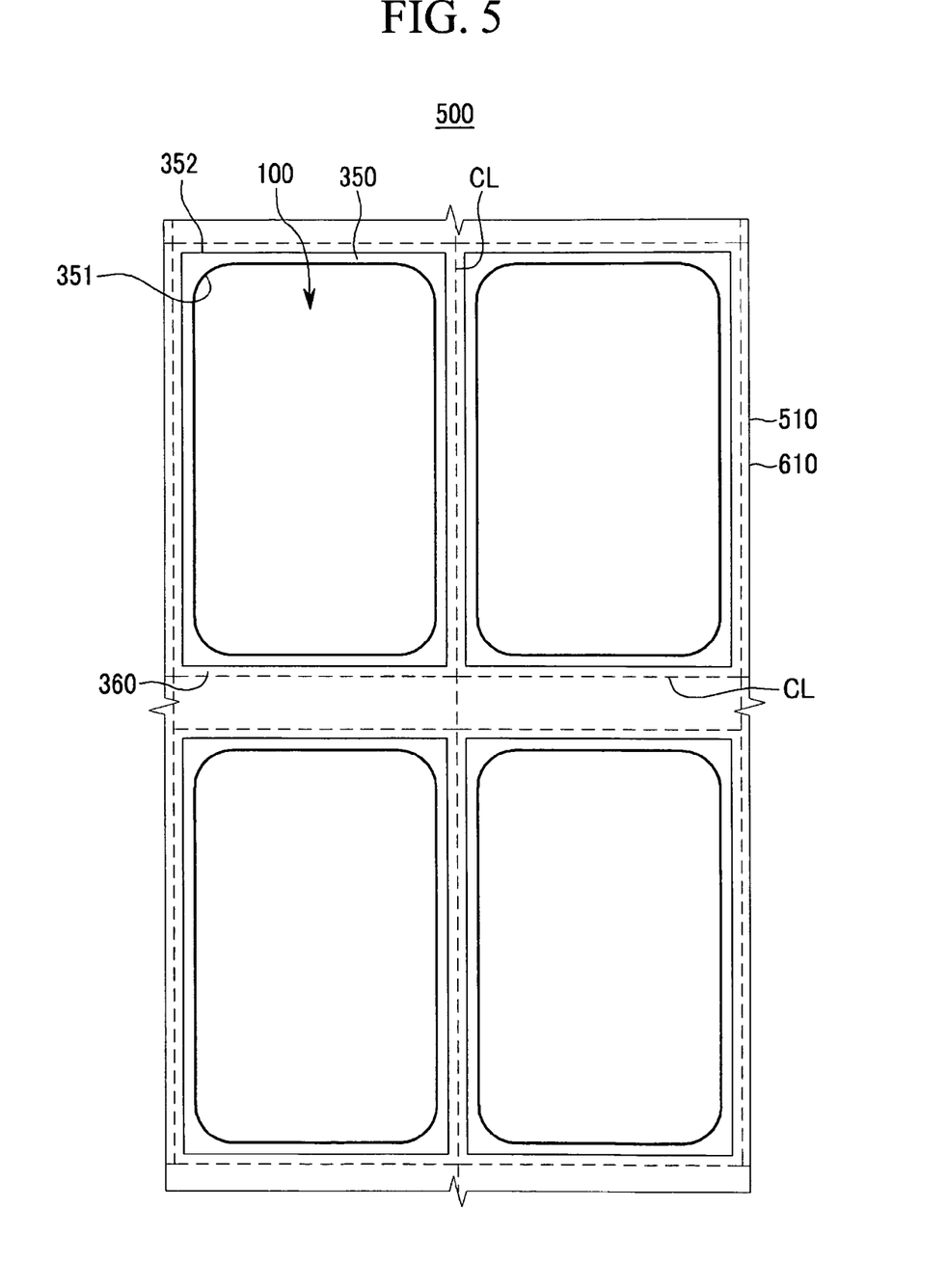
FIG. 5 is a top plan view of a mother display panel.

FIG. 5 shows a mother display plane 500 divided to form the OLED display 100. That is, OLED displays 100 are formed in the mother display panel 500 first, and are then simultaneously divided into a plurality of OLED displays 100.

As shown in FIG. 5, the mother display panel 500 broadly includes a mother display substrate 510 and a mother sealing member 610 disposed opposite to the mother display substrate 510. The mother display substrate 510 includes a plurality of OLEDs 70 (shown in FIG. 2), and the mother sealing member 610 covers the OLEDs 70. In addition, a sealant 350 is disposed a plurality of times to seal the mother display substrate 510 and the mother sealing member 610.

The mother display substrate 510 is cut along a cutting line and then divided into a plurality of display substrates 110, each including the OLED 70. In this case, the mother sealing member 610 is cut in a state of being sealed with the mother display substrate 510. Thus, the mother display panel 500 is divided into the plurality of OLED displays 100.

The sealant 350 is formed at each of the divided OLED displays 100 along an edge thereof. In this case, in at least one corner area of the OLED display 100, the sealant 350 has a curved inner surface 351 and an angular outer surface 352. Here, a detailed structure of the sealant 350 is the same as described above with reference to FIG. 3. With such a structure, damage to the corner areas of the display 100 during the cutting process of the mother display panel 500 can be suppressed. That is, since the sealant 350 supports the display substrate 110 and the sealing member 210 at the corner areas thereof, displacement of the vertical direction that occurs when the display substrate 110 and the sealing member 210 are pressed during the cutting process can be reduced, thereby suppressing a problem in which the OLED display 100 is broken.

Particularly, since each sealant 350 has the curved inner surface 351 and the angular outer surface 352 in the corner areas of the display substrate 110 and the sealing member 210, the OLED displays 100 formed by being divided from the mother display panel 500 can be further improved in mechanical strength.

In addition, the mother display panel 500 further includes the reinforcement member 360 that fills a space between the mother display substrate 510 and the mother sealing member 610 from the outer surface 352 of the sealant 350.

The reinforcing member 360 prevents the display substrate 110, the sealing member 210, and the sealant 350 from being easily broken during the process through which the mother display panel 500 is cut and divided into the plurality of OLED displays 100, and functions as an assistant sealing member when the sealant made of a frit becomes molten or its adhesive force becomes weak.

The reinforcing member 360 is provided as a liquid material that is hardened into a space between the mother display substrate 510 and the mother sealing member 610 by using a capillary effect. In this case, the outer surface 352 of the sealant 350 helps the reinforcing member 360 to be stably provided by promoting the capillary effect to be stably generated.

In addition, since the inner surface 351 of the sealant 350 is curved at the corner areas of the display substrate 110 and the sealing member 210, a coating area of the sealant 350 can be more efficiently designed.

Hereinafter, a manufacturing method of the OLED display 100 according to an exemplary embodiment of the present invention will be described with reference to FIG. 5.

First, a mother display substrate 510 and a mother sealing member 610 are provided. The mother display substrate 510 includes a plurality of OLEDs 70 (shown in FIG. 2), and will be cut along a cutting line CL and thus divided into a plurality of display substrates 110.

A sealant 350 is coated on at least one of the mother display substrate 510 and the mother sealing member 610, and the mother display substrate 510 and the mother sealing member 610 are sealed to each other, interposing the sealant 350 therebetween. Here, the sealant 350 is disposed along edges of a plurality of OLED displays 100 that are to be formed by division, and has a curved inner surface 351 and an angular outer surface 352 at corner areas of each of the plurality of OLED displays 100.

The sealant 350 has a constant width in other areas excluding the corner area, and the width is gradually increased near the edge of the corner area. In addition, the outer surface 352 of the sealant 350 is formed in parallel with edges of the OLED displays 100 to be formed by division.

The sealant 350 is made of a material including a frit. In addition, the sealant 350 may be formed by a screen printing method. However, the exemplary embodiment of the present invention is not limited thereto. Therefore, the sealant 350 may be made of a material including epoxy resin, or may be made of other well-known materials.

Next, a liquid material to be hardened is provided into a space between a mother display substrate 510 disposed outside of the outer surface of the sealant 350 and the mother sealing member 610 by using a capillary effect, and then a reinforcing member 360 is formed by hardening the liquid material. In this case, the outer surface 352 of the sealant 350 helps the reinforcing member 360 to be stably provided by promoting the capillary effect to be stably generated.

The reinforcing member 360 prevents the display substrate 110, the sealing member 210, and the sealant 350 from being easily broken when the mother display panel 500 is cut to be divided into the plurality of OLED displays 100, and functions as an assistant sealing member when a sealant 350 made of a frit becomes molten or its adhesive force becomes weak.

Next, the mother display panel 500 formed by sealing the mother display substrate 510 and the mother sealing member 610 is cut along the cutting line and divided into the plurality of OLED displays 100. The sealant 350 prevents the corner areas of the OLED displays 100 from being damaged during the cutting process of the mother display panel 500. That is, since the sealant 350 sufficiently supports the display substrate 100 and the sealing member 210 at the corner areas, displacement in the vertical direction that occurs when the display substrate 110 and the sealing member 210 are pressed during the cutting process can be reduced, thereby suppressing a problem in which the OLED display 100 is broken.

Particularly, since the sealant 350 has the curved inner surface 351 and the angular outer surface 352 at the corner areas of the display substrate 110 and the sealing member 210, mechanical strength of the OLED display 100 can be further improved.

In addition, the inner surface 351 of the sealant 30 is curved at the corner areas of the display substrate 110 and the sealing member 210, and therefore a coating location of the sealant 350 can be more efficiently designed.

Hereinafter, an experimental example and a comparative example will be described with reference to Table 1 and Table 2. In the experimental example, the sealant 350 has the curved inner surface 351 and the angular outer surface 352 at the corner areas of the display substrate 110 and the sealing member 210 according to the exemplary embodiment of the present invention, and a sealant of the comparative example has a curved inner surface and a curved outer surface.

In further detail, the sealants 350 in both the experimental example and the comparative example have an average width of 5 mm. In the corner areas of the experimental example, the curved inner surface 351 has a curvature radius of 0.7 mm and the outer surface 352 is angularly formed. Meanwhile, in the corner areas of the comparative example, the curved inner surface has a curvature radius of 0.7 mm and the curved outer surface has a curvature radius of 1.2 mm.

Two experiments were performed by using the experimental example and the comparative example having the above structures.

The first experiment was performed in a way such that the OLED display 100 was applied with external pressure that is similar to pressure applied thereto during the cutting process considering that the OLED display 100 is formed by division of the mother display panel 100 through the cutting process.

In the above-stated condition, vertical direction displacement generated in the experimental and comparative examples that were respectively applied with the external pressure are shown in Table 1.

TABLE 1

|  | Experimental example | Comparative example |
|---|---|---|
| Maximum pressure in a vertical direction | 63 MPa | 360 MPa |

As shown in Table 1, the vertical direction displacement of the experimental example is relatively small. That is, the OLED display 100 according to the exemplary embodiment of the present invention can be prevented from being broken in the corner areas.

In the second experiment, the OLED display 100 is dropped from the same height with the same conditions in the experimental example and the comparative example to calculate a ratio of occurrence of breaks of the corners.

TABLE 2

|  | Comparative example | Experimental example |
|---|---|---|
| Number of tests | 18173 | 1212 |
| Corner break ratio (%) | 0.40 | 0.25 |

As shown in Table 2, the corner of the experiment example is broken relatively fewer times than that of the comparative example. That is, the mechanical strength of the OLED display according to the exemplary embodiment of the present invention is further improved.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode (OLED) display comprising:
    a display substrate including an OLED;
    a sealing member disposed opposite to the display substrate and covering the OLED; and
    a sealant interposed between the display substrate and the sealing member to seal the display substrate and the sealing member,
    wherein the sealant has a curved inner surface and an angular outer surface in at least one of corner areas of the display substrate and the sealing member, and
    wherein the curved inner surface of the sealant has a curvature radius in a range of about 0.5 mm to 1.5 mm.

2. The OLED display of claim 1, wherein the width of the sealant formed in the at least one of the corner areas of the display substrate and the sealing member is gradually increased near a corner of the corner area.

3. The OLED display of claim 2, wherein the outer surface of the sealant is substantially parallel with an edge of the sealing member.

4. The OLED display of claim 1, wherein the sealant comprises at least one of a frit and epoxy resin.

5. The OLED display of claim 1, further comprising:
    a reinforcing member disposed adjacent to the outer surface of the sealant and filling a space between the display substrate and the sealing member.

6. A manufacturing method of an organic light emitting diode (OLED) display, comprising:
    preparing a mother display substrate and a mother sealing member;
    coating a sealant on at least on of the mother display substrate and the mother sealing member;
    sealing the mother display substrate and the mother sealing member while interposing the sealant therebetween; and
    cutting the sealed mother display substrate and the mother sealing member together and dividing them into a plurality of OLED displays,
    wherein the sealant is formed along an edge of the plurality of OLED displays to be formed by division, and
    in a corner area of at least one of corner areas of the OLED display, the sealant has a curved inner surface and an angular outer surface, said curved inner surface of the sealant has a curvature radius in a range of about 0.5 mm to 1.5 mm.

7. The manufacturing method of claim 6, wherein the width of the sealant formed in the at least one of the corner areas of the OLED display is gradually increased near a corner of the corner area.

8. The manufacturing method of claim 7, wherein the outer surface of the sealant is substantially parallel with an edge of the sealing member.

9. The manufacturing method of claim 6, wherein the curved inner surface of the sealant has a curvature radius in a range of about 0.5 mm to 1.5 mm.

10. The manufacturing method of claim 6, wherein the sealant comprises at least one of a frit and epoxy resin.

11. The manufacturing method of claim 6, wherein the sealant is formed by a screen printing method.

12. The manufacturing method of claim 6, further comprising:
    filling a space between the mother display substrate and the mother sealing member with a reinforcing member that is adjacent to the outer surface of the sealant.

13. The manufacturing method of claim 12, wherein the reinforcing member is filled by using a capillary effect.

14. An organic light emitting diode (OLED) display, comprising:
    a display substrate including an OLED;
    a sealing member disposed opposite to the display substrate and covering the OLED; and
    a sealant interposed between the display substrate and the sealing member to seal the display substrate and the sealing member, said sealant comprising:
        a curved inner surface having a predetermined curvature radius in at least one corner area of said display substrate and said sealing member; and
        an angular outer surface in said at least one of corner area of said display substrate and said sealing member,
        wherein sealant is widest at said curved inner surface than at any other point of said sealant, and
    wherein the curved inner surface of the sealant has a curvature radius in a range of about 0.5 mm to 1.5 mm.

15. The OLED display of claim 14, wherein the width of the sealant formed in the at least one of the corner areas of the display substrate and the sealing member is gradually increased near a corner of the corner area.

16. The OLED display of claim 15, wherein the outer surface of the sealant is substantially parallel with an edge of the sealing member.

17. The OLED display of claim 14, wherein the sealant comprises at least one of a frit and epoxy resin.

18. The OLED display of claim 14, further comprising:
    a reinforcing member disposed adjacent to the outer surface of the sealant and filling a space between the display substrate and the sealing member.

* * * * *